(12) United States Patent
Pourrahimi et al.

(10) Patent No.: US 6,531,233 B1
(45) Date of Patent: Mar. 11, 2003

(54) SUPERCONDUCTING JOINT BETWEEN MULTIFILAMENTARY SUPERCONDUCTING WIRES

(76) Inventors: Shahin Pourrahimi, 1272 Beacon St., Brookline, MA (US) 02446; Nadder Pourrahimi, 42-5 Briarwood, Marlborough, MA (US) 01752

( * ) Notice: Subject to any disclaimer, the term of this patent is extended or adjusted under 35 U.S.C. 154(b) by 0 days.

(21) Appl. No.: 09/848,131

(22) Filed: May 3, 2001

Related U.S. Application Data

(60) Provisional application No. 60/201,749, filed on May 4, 2000.

(51) Int. Cl.$^7$ ................................................ B32B 15/00
(52) U.S. Cl. ..................... 428/615; 428/107; 505/220; 505/231
(58) Field of Search ................. 428/615, 105, 428/107, 109, 111, 930; 505/220, 231, 232

(56) References Cited

U.S. PATENT DOCUMENTS

| | | | | |
|---|---|---|---|---|
| 4,094,060 A | * | 6/1978 | Madsen et al. | 148/668 |
| 4,652,697 A | * | 3/1987 | Ando et al. | 174/125.1 |
| 6,038,462 A | * | 3/2000 | Snitchler et al. | 174/125.1 |
| 6,199,266 B1 | * | 3/2001 | Meserve | 174/125.1 |
| 6,357,105 B1 | * | 3/2002 | Hikata et al. | 29/599 |
| 6,397,454 B1 | * | 6/2002 | Seuntjens et al. | 174/125.1 |

* cited by examiner

Primary Examiner—Tom Dunn
Assistant Examiner—Coleen P. Cooke
(74) Attorney, Agent, or Firm—William Nitkin

(57) ABSTRACT

A superconducting joint between multifilamentary superconducting wires through an optional superconducting medium where at least one of such components is an interconnected filament superconducting part is disclosed. Such joint and method for producing same can include a bridge made of a superconducting medium to contact and make electrical connection with the side of such wire.

34 Claims, 7 Drawing Sheets

US 6,531,233 B1

SUPERCONDUCTING JOINT BETWEEN MULTIFILAMENTARY SUPERCONDUCTING WIRES

This application claims benefit and priority of U.S. provisional application No. 60/201,749 filed May 4, 2000.

BACKGROUND OF THE INVENTION

1. Field of the Invention

The present invention relates generally to the use of superconducting wires and more particularly relates to methods of joining such superconducting wires.

2. Description of the Prior Art

Superconductivity is the phenomenon where, when a particular material, such as a wire, is subjected to successively colder temperatures, it undergoes a state transition where all electrical resistance disappears, i.e. the material can conduct electricity without generating any heat, i.e., loss of energy. At this stage the material is said to have become a superconductor. This transition only occurs in specific metals/alloys and compounds. The state of superconductivity for a given superconductor is a function of its temperature, background magnetic field, and transport electric current. A superconductor carries current without resistance when it is below its critical temperature (Tc) and is in an environment, often referred to as background, where the magnetic field is less than its critical magnetic field (Bc). The limit of superconducting transport current in a superconductor depends on how much the operating temperature (To) and background magnet field (Bo) are below its Tc and Bc. The lower the To and Bo, the higher the limit in transport current.

There are currently two known types of superconductors: Type I and Type II. Compared to the Type I, the Type II superconductors carry more current at higher temperatures and exhibit an "upper critical magnetic field" (Bc2) which depending on the material can be as high as a few tens of tesla (T). [see for example, Stability of Superconductor, by Lawrence Dresner, Plenum Press, New York, N.Y., 1995, Chapter 1]. Practically all superconductors in commercial use are Type II.

A useful class of product made of superconductors is superconducting wires. Superconducting wires, and cables made from them, are widely used in fabrication of electromagnets, hereafter referred to as magnets, that generate magnetic fields higher than 1 tesla.

Magnets are produced by winding wires in various coil geometries. When electric current passes through the winding, a magnetic field is produced. When the wire is a superconductor, no electric power is lost in the magnet and it is called a superconducting magnet.

A current market for superconducting magnets is in devices used for Magnetic Resonance Imaging (MRI) and Nuclear Magnetic Resonance (NMR) spectroscopy. These devices require constant and stable magnetic fields.

A constant and stable magnetic field can be produced by flow of current through a superconducting magnet in which the ends of the superconducting wires that make up the magnet are joined together by a superconducting joint. In an ideal superconducting joint, the transport current from one wire must enter into another without electrical resistance. In such a case, current circulates in the windings of the superconducting magnet without appreciable loss of energy in the magnet, or the joint, and therefore the magnetic field that the magnet produces remains constant and the superconducting magnet is said to be in a "persistent mode" providing the desired constant and stable magnetic field. Thus, superconducting joints are vital components of superconducting magnets that are used in MRI and NMR devices.

For reasons that relate mainly to stability of superconductors, superconducting wires used in most magnet application are multifilamentary (MF) composites [see for example Stability of Superconductor, by Lawrence Dresner, Plenum Press, New York, N.Y., 1995]. In a multifilament superconductive wire the superconducting current is carried by superconducting filaments.

FIG. 1 illustrates a cross-section of superconducting filaments 24 spaced apart from one another within matrix 28 forming multifilamentary wire 20 such as used in most superconducting magnets in use today which filaments can be made from Niobium-Titanium (Nb—Ti) alloy. The Tc and $Bc_2$ for Nb—Ti are about 10 Kelvin (K) and about 10 T, respectively. Nb—Ti alloy is ductile and basically insensitive to strain and its use in fabricating MF wires, and subsequently in a magnet, is straightforward and comparatively less expensive than other materials.

Superconducting magnets for operation at fields higher than about 10 T rely principally on the use of type A15 superconductors. Among the A15 superconductors the $Nb_3Sn$ based wires are most practical for large scale production. This is basically due to the fact that fabrication of $Nb_3Sn$ conductors is less complicated, and more economical than others. Almost all operating A15 magnets to date have used $Nb_3Sn$ conductors. The Tc and $Bc_2$ for $Nb_3Sn$ are about 18 K and about 23 T, respectively. With proper alloying of the $Nb_3Sn$ phase, for example by Ta, its critical properties can be improved. Other A15 superconductors such as $Nb_3Al$ that have better superconducting properties than $Nb_3Sn$ are under development.

$Nb_3Sn$, like other A15 type superconductors, is an intermetallic compound and is inherently brittle. Therefore $Nb_3Sn$ does not lend itself to normal conductor fabrication methods where a given material undergoes significant plastic deformation. For most applications in magnet technology, $Nb_3Sn$ superconductors are produced by a two-step process in which a multifilamentary composite wire that contains Nb and Sn in separate regions is formed into wire and then, during a subsequent reaction heat treatment at, for example, 650C–750C, the $Nb_3Sn$ is formed by solid state reaction. Fabrication of $Nb_3Sn$ MF wires and their use in magnets is relatively more difficult and expensive than MF Nb—Ti wires.

A high field superconducting magnet for "high end" NMR spectrometer, for example 14T for a 600 MHz device, is typically comprised of a number of nested coils (solenoids). Please refer, for example, to J. E. C. Williams, S. Pourrahimi, Y. Iwasa, and L. J. Neuringer,"A 600 MHz Spectrometer Magnet," IEEE Trans. Vol. Mag-25, pp. 1767–1770, 1989. Currently, for both economy and practicality, a high field superconducting NMR magnet uses a few coils that use Nb—Ti MF wires and a few coils that use $Nb_3Sn$ MF wires. The Nb—Ti coils combine to produce a field of up to about 10T and the $Nb_3Sn$ coils add the remaining increments of the magnetic field. FIG. 2 shows a simplified drawing of the nested coils of Nb—Ti 12 and $Nb_3Sn$ 14 that make up such a high field NMR magnet. A typical high field NMR magnet requires a number of superconducting joints 16 that connect through superconducting connectors 18 the nested coils to form a single unit magnet system. Magnets used in MRI devices also require superconducting joints that connect the multiple superconducting magnet modules of an overall superconducting magnet systems. Superconducting joints are also key components of "persistent switches" that are used in both NMR and MRI devices. A description of a persistent switch is given for example in Superconducting Magnets, M. N. Wilson, Oxford University Press, New York, N.Y. (1983), Chapter 11.

With improvements in economy of fabrication of A15 superconductors and the advantage that they can operate at relatively higher temperatures, next generation high field NMR magnets, or MRI magnets, may use A15 superconductors and coils exclusively.

In most conventional MF superconducting wires 20, as for example in FIG. 1, the superconducting filaments 24 are disconnected from one another for the most part. Therefore, to fabricate a superconducting joint between two MF wires often superconducting filaments 24 of the wires 20 are accessed at the wire ends by separating filaments 24 from their matrix 28. This is often done by dissolving matrix 28. In a conventional superconducting joint between two MF superconducting wires the current transfers from the filaments of one wire to the filaments of the other wire, at wire ends, through a superconducting medium. Such connection can be achieved, for example, by dissolving the metallic matrix at the wire ends and encapsulating the filaments of the wires in a superconducting solder (medium). See for example C. A. Swenson, and W. D. Markiewicz, "Persistent Joint Development for High Field NMR", IEEE Transaction on Superconductivity, Vol. 9, No. 2, pp. 185–188, 1999. In yet another joint example, the matrix is dissolved and then the filaments of the wires are brought into direct contact and are then kept under compression. In yet another example, the matrix is dissolved and then the filaments of the wires are brought into contact with a superconducting medium that is a composite of consolidated Nb and Sn powders. Reference is made to J. E. C. Williams, A. Zhukovsky, R. Derocher, "Superconducting Joints With Niobium-Tin," U.S. Pat. No. 5,290,638, 1994. In this design, after making the connections between the filaments and the Nb—Sn composite, the composite needs to be heat treated to form the $Nb_3Sn$ superconducting phase of the medium within the composite.

Superconducting joints are also useful in applications other than joining superconducting wires in magnets or coils. They can be used to join wires to produce a relatively longer piece of superconducting wire, or to repair a broken piece of superconducting wire.

SUMMARY OF THE INVENTION

Often, the superconducting properties of the materials used in a joint dictate limitations in the design of the overall magnet including: 1) operating temperature; 2) location of the joint (background field condition); and 3) overall magnet assembly procedure. There is a need in the art for superconducting joints with better properties that can overcome the preceding limitations. In this patent application, $Nb_3Sn$ is discussed only as one example of a superconductor and the principals of invention can apply to all MF superconductive wires.

In this invention the MF superconducting wires and joints are designed and produced to provide high performance relative to current transfer at the surface of superconducting wires.

A key factor in the functionality of joints in this invention is that the superconducting medium connecting separate superconducting wires is a multifilamentary medium with interconnected filaments. In the joints of this invention, preferably but not necessarily, the MF superconducting wires are produced in a way that the individual filaments are substantially interconnected. FIG. 3 shows the cross section of a MF $Nb_3Sn$ superconducting wire 22 with interconnected filaments 24. When such superconducting filaments 24 are interconnected and are made to appear at the surface of the wire, electrical contact with filaments 24 on outer surface 26 of the wire in effect results in contact with substantially all filaments 24. Therefore, superconducting joints can be produced by making contact with filaments 24 on the wire surface 26. The present invention allows the fabrication of superconducting joints between two such similar MF wires, for example, Nb—Ti to Nb—Ti, or $Nb_3Sn$ to $Nb_3Sn$, or dissimilar wires, for example, Nb—Ti to $Nb_3Sn$.

An important implication of using wires with interconnected filaments is that when several wires of this type are joined and compacted, the filament inter-connectivity extends over the interior surface of the wire bundle, and all filaments of all wires may be accessed by contact with the exterior surface of the wire bundle. This feature is useful for making joints on cables of superconducting wires. Hereinafter all references to "wire" should be considered to include both wire and cable.

Another advantage of this approach is that the bridge can be a multifilamentary superconducting medium similar to the wires to be joined. This feature allows the superconductor joint to operate in background conditions that are determined by the properties of the multifilamentary superconductors. In contrast, for example, when a superconducting solder is used, the background condition is determined by the properties of the solder.

Therefore it is an object of this invention to provide a superconducting joint between a multifilamentary superconducting wire engaged to a superconducting wire having interconnected superconducting filaments disposed within a superconducting medium. The interconnected filament superconducting wire can have two ends and an outer surface in electrical contact with said wire containing superconducting filaments. Such interconnected filament superconducting wire can be produced by many processes including, but not limited to, a powder metallurgy process and a cable-in-tube process. A superconducting. bridge can be disposed around portions of said superconducting wires wherein said connection between said superconducting wires relies both on contact between said ends of said wires and said outer surfaces of said interconnected filament superconducting wire contacting said bridge. The interconnected filament superconducting wire can be comprised of a plurality of irregular, and irregularly dispersed, superconducting filaments within a superconductive matrix medium with certain of said filaments extending to the outer surface of said wire and contacting other of said filaments within the body of said wire. The superconducting bridge and medium-containing wires can be held under compression within a mechanical fixture including, but not limited to, a shrink-fit collar.

Thus a method of producing a superconductive joint between two superconducting wires is disclosed comprising the steps of providing a superconducting medium with multiple dispersed interconnected filaments therein and engaging said superconducting medium with at least two MF superconducting wires to form a superconductive joint. Such method can also include the step of engaging said superconducting wires with multiple irregularly dispersed interconnected filaments. When using such superconducting wires with multiple irregularly dispersed interconnected filaments, a superconducting joint can be produced by bringing the wire ends into direct electrical contact. Such method can also include the step of engaging said superconducting wire with multiple irregularly dispersed interconnected filaments indirectly to said other superconducting wire to form a superconducting joint. The method further includes the steps of providing said interconnected filaments within and on the outer surface of one of said wires and contacting by a bridge medium said filaments on said outer surface of said wire.

DESCRIPTION OF THE PREFERRED EMBODIMENT(S)

Figure 1:
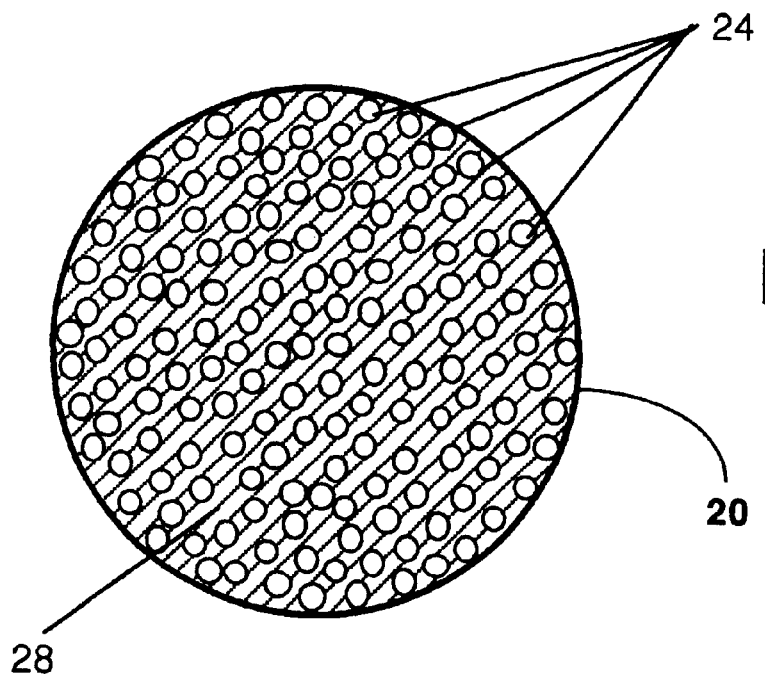
FIG. 1 shows the transverse cross-section of a typical prior art superconducting MF wire with separate discrete filaments.
Figure 2:
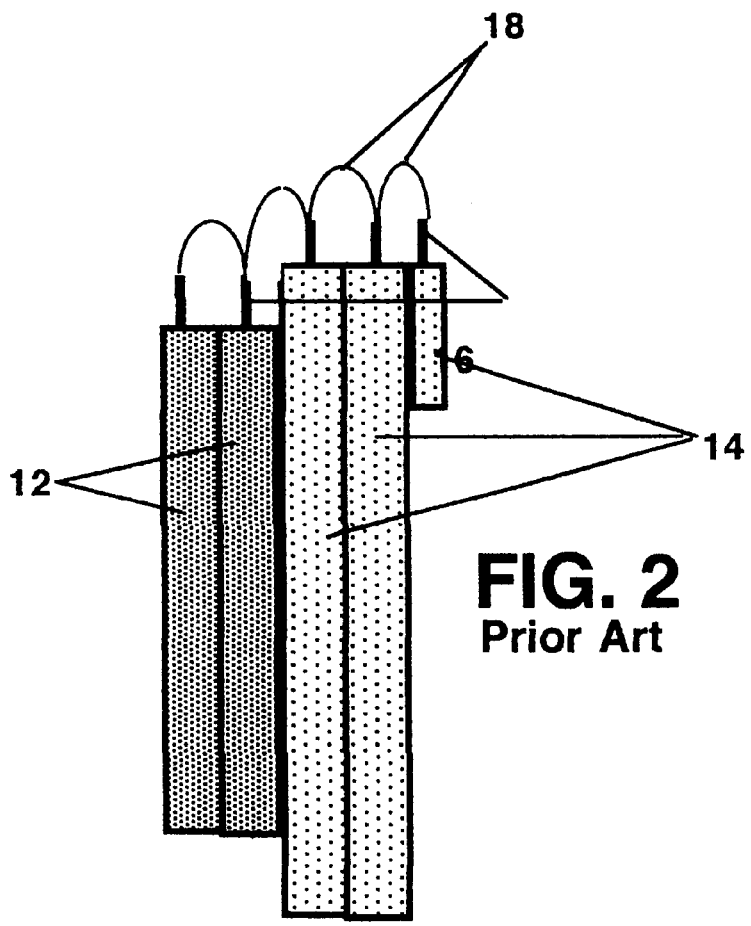
FIG. 2 illustrates a side view of a section of a coil for a prior art magnetic system for NMR spectroscopy.
Figure 3:
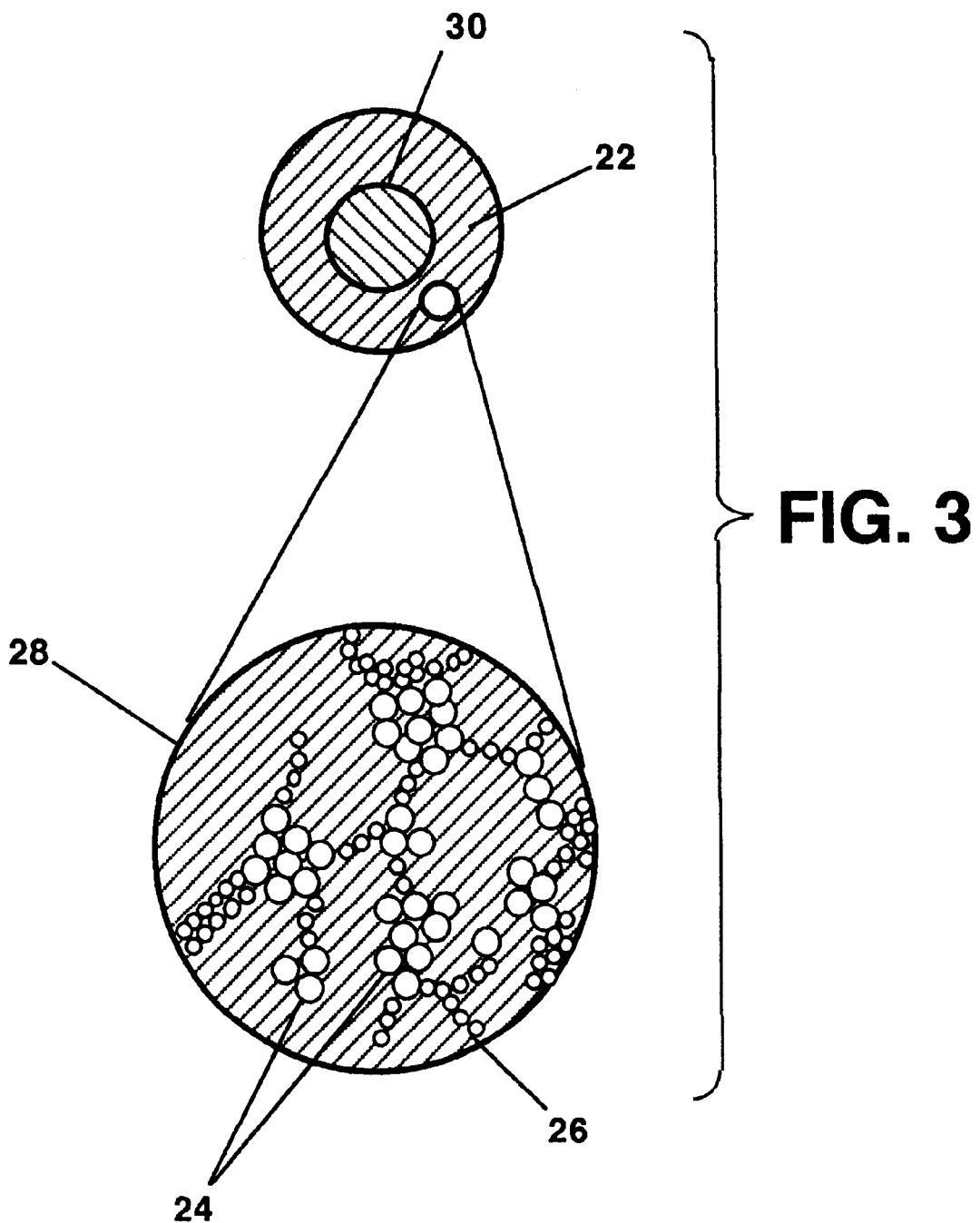
FIG. 3 illustrates a cross-sectional view of a MF wire with interconnected filaments.

FIG. 3 illustrates the interconnected filament wire 22 of this invention disposed around a core 30. An enlarged section of the interconnected filament wire 22 shows the superconducting filaments 24 irregularly shaped and arranged within the medium matrix 28 with portions of the superconducting filaments 24 extending to the wire surface 26 such that electrical contact made with any of the superconducting filaments 24 on wire surface 26 has the effect of making electrical contact with all of the superconducting filaments 24 within the body of the interconnected filament wire 22. Interconnected filament superconducting wires can also be produced by the cable-in-tube process as taught in out co-pending patent application entitled Method of Production of Multifilamentary Wires, Ser. No. 09/696,417 filed Oct. 25, 2000. In contrast, one can clearly see in the multifilamentary wire 20 of FIG. 1 that the prior art wire disposes a plurality of superconducting filaments 24 within the matrix medium 28 spaced apart from one another such that there is little or no electrical contact between the discrete superconducting filaments 24.

Figure 4:
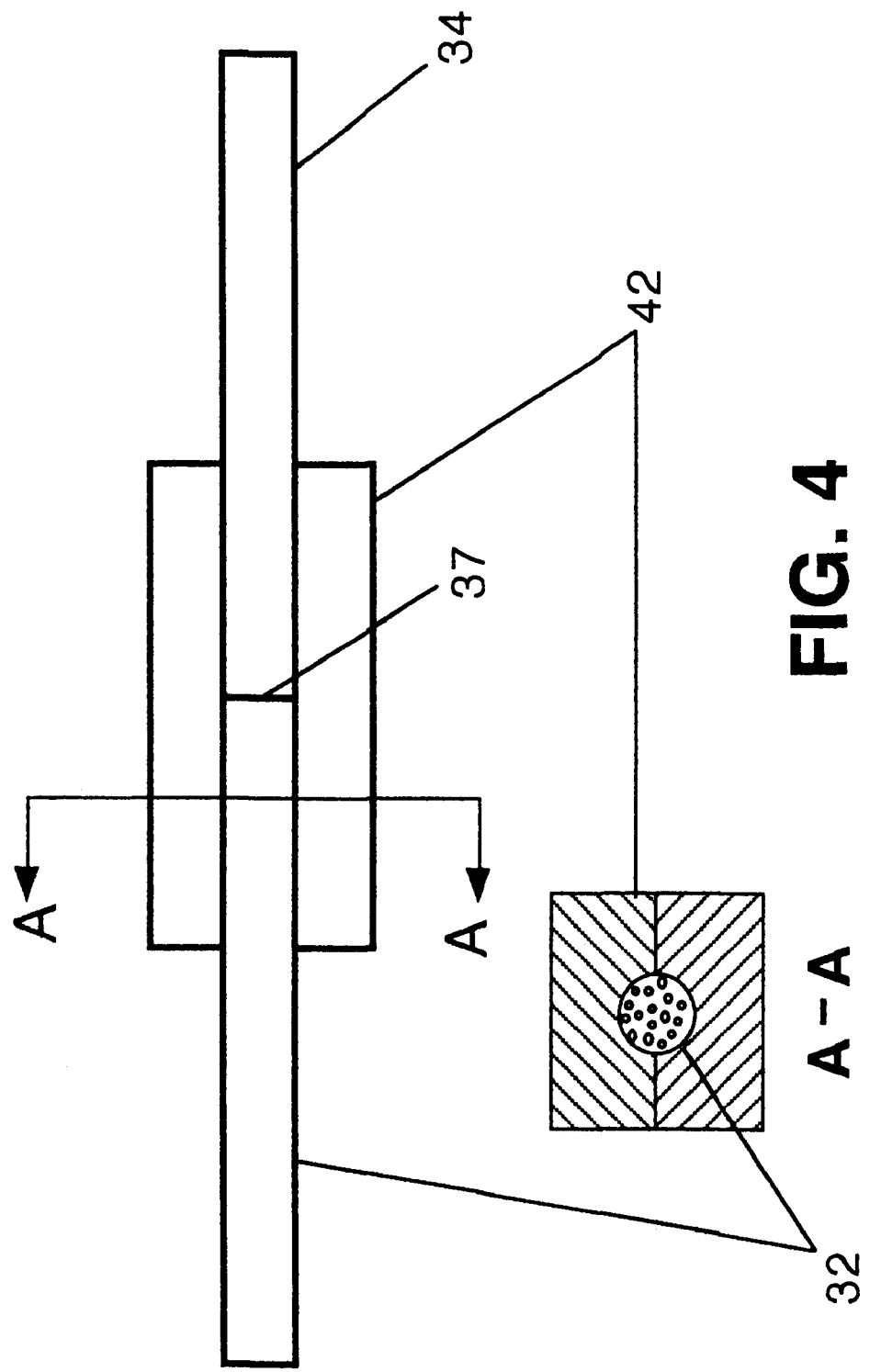
FIG. 4 illustrates a transverse cross-sectional view of two interconnected filament wires joined at their ends.
Figure 8:
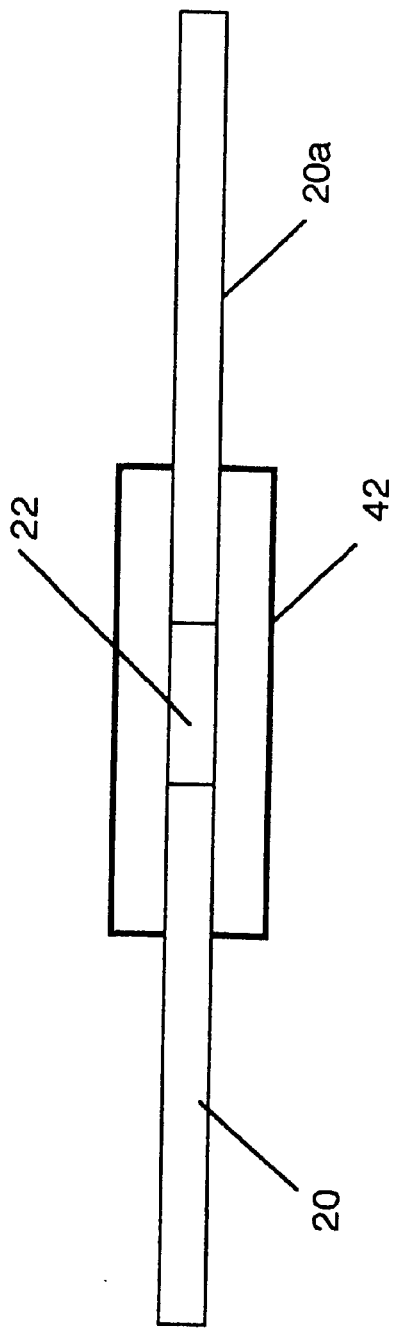
FIG. 8 illustrates a transverse cross-sectional view of two multifilamentary wires joined by an interconnected filament wire.

In one embodiment of this invention two interconnected filament wires 32 and 34 can be joined directly at their ends 37, as depicted in FIG. 4 within a holding device 42. The holding device can be a compression device such as a mechanical fixture which includes a shrink-fit collar. In this case all filaments of one wire are directly connected to all filaments in the other wire. When using A15 superconducting wires, this type of joint can be produced either before or after the reaction heat treatment. An important variation of this type of joint is that, for wires in which the filament content is high enough, superconducting current transfer between two MF superconducting wires can occur even if one of the wires does not have interconnected filaments because the interconnected filaments of the MF wire on one side electrically short the separated filaments of the wire on the other side. An embodiment of this variation is that a conventional MF Nb—Ti wire with separated filaments can be joined to a MF $Nb_3Sn$ wire that has interconnect filaments. In another similar embodiment, as seen in FIG. 8, a superconducting joint between two MF superconducting wires 20 and 20a with separate discrete filaments can be produced by using a intermediary MF superconducting wire section 22 that has interconnect filaments within holding device 42 as the interconnected filament wire 22 will electrically short the separated filaments of the multifilamentary wire 20 and 20a at each end thereof.

Figure 5:
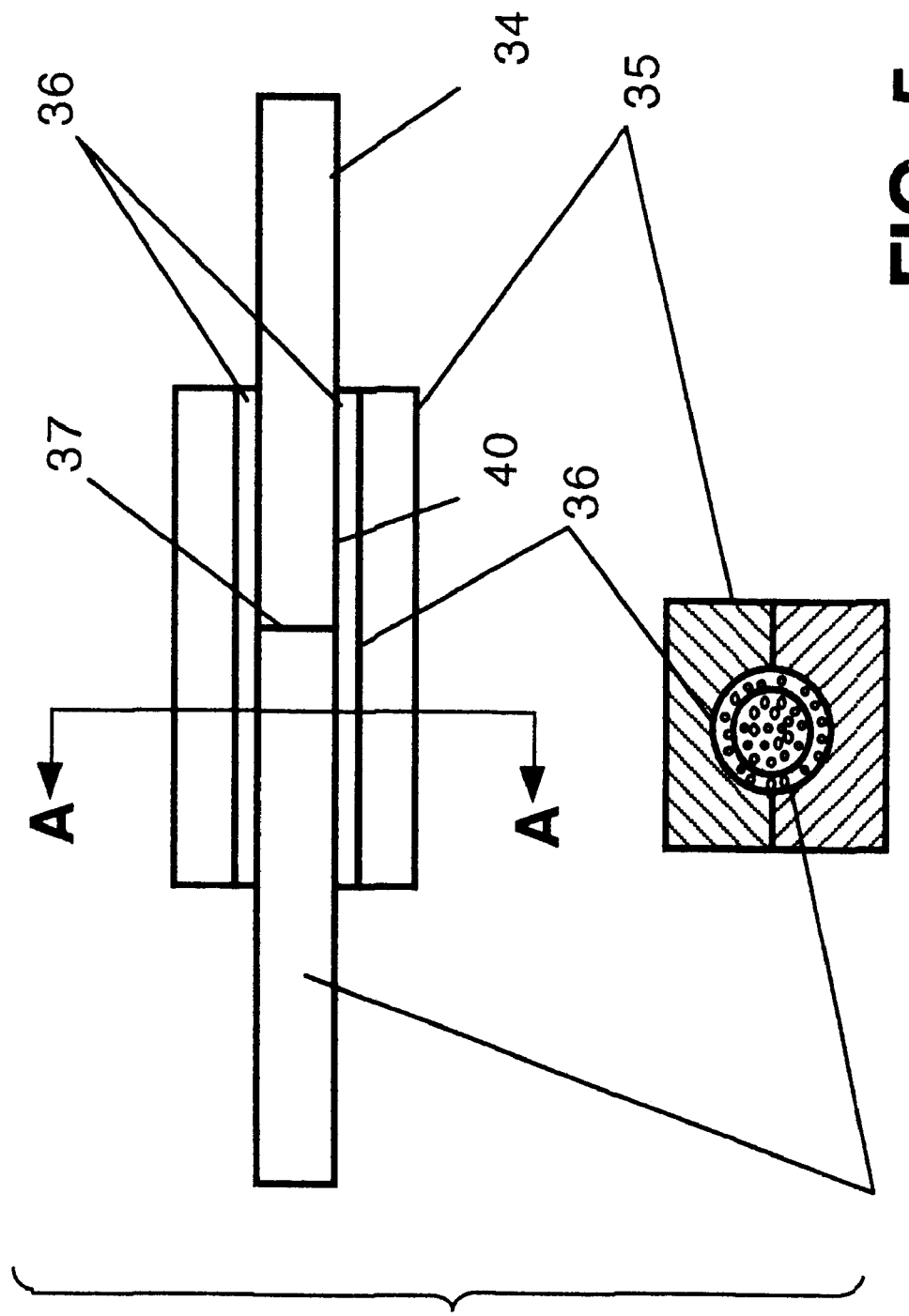
FIG. 5 illustrates a transverse cross-sectional view of a superconducting joint using a bridge between two superconducting interconnected filament wires.
Figure 6:
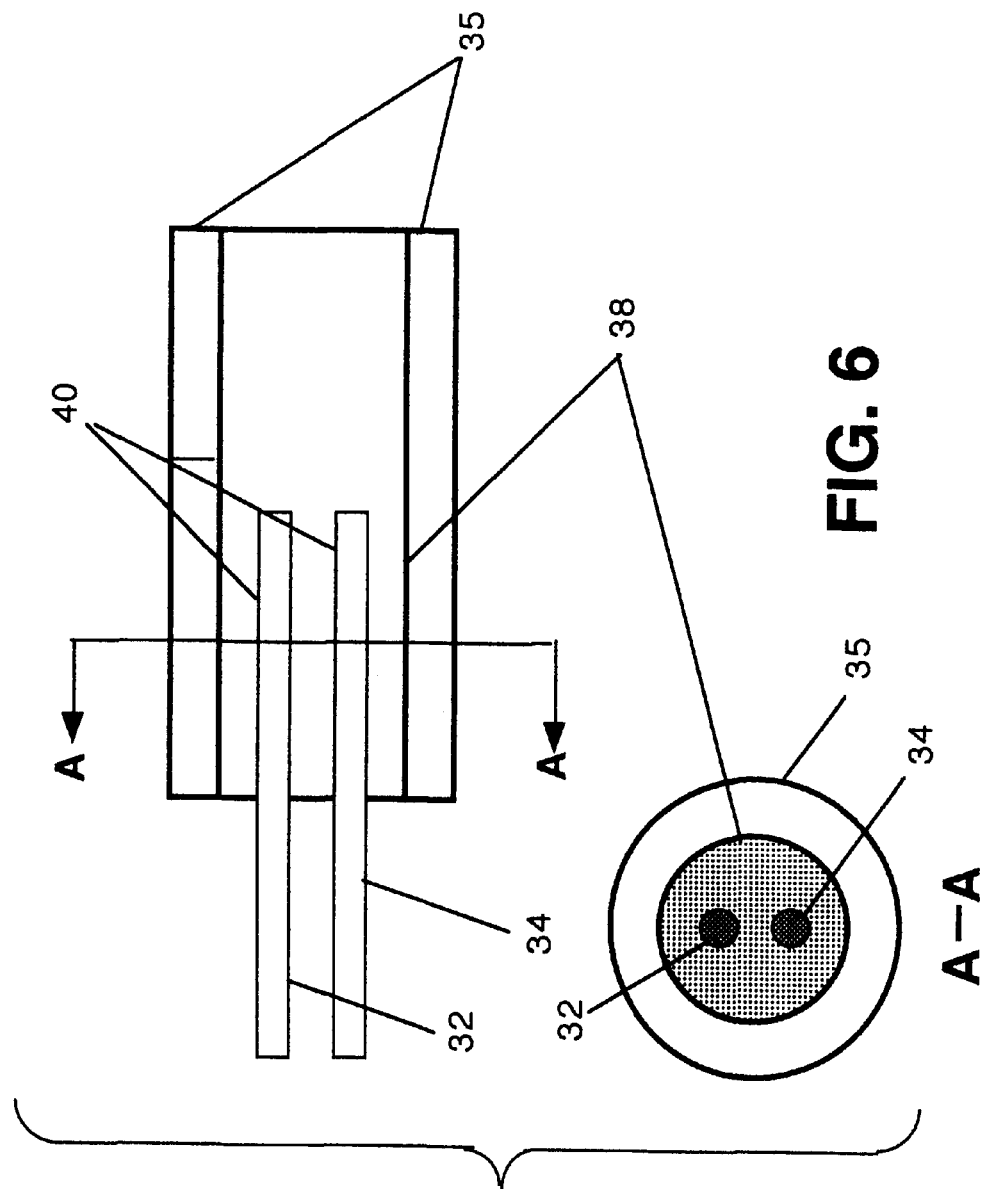
FIG. 6 illustrates a transverse cross-sectional view of a superconducting joint where the two superconducting interconnected filament wires are not aligned.

In another embodiment, superconducting joints can be constructed by using a superconducting bridge 36 (medium) that connects the outer surfaces 40 of two opposing wires 32 and 34. FIG. 5 shows the basic feature of this type of joint. When using A15 superconducting wires this type of joint can be produced either before or after the reaction heat treatment. An important feature of this embodiment is that bridge 36 can be an MF superconducting medium similar to the wires to be joined. This feature allows the superconductor joint to operate in background conditions that are determined by the properties of the MF superconductors. In contrast, for example, when a superconducting solder is used in prior art connections, the background conditions are determined by the properties of the superconducting solder. FIG. 6 shows a variation of this embodiment in which superconducting wires 32 and 34 are not aligned along the same line but are positioned in medium bed 38 which contacts each wire on its side 40.

Figure 7:
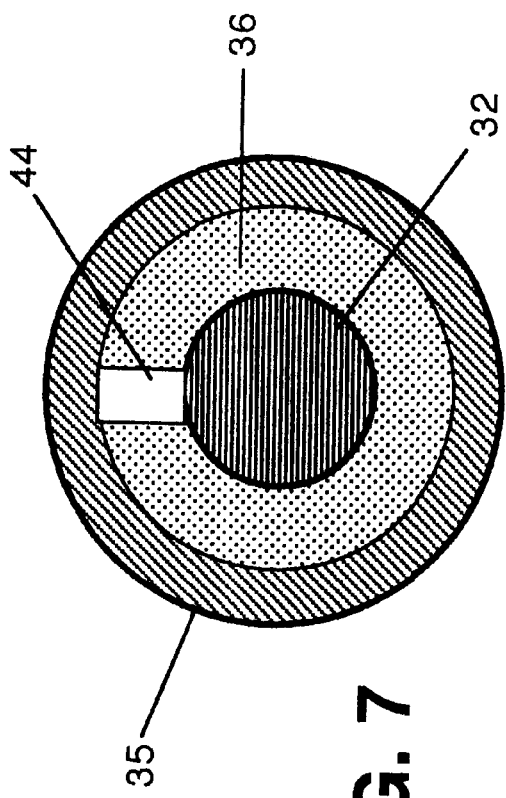
FIG. 7 illustrates a cross-sectional view of a superconducting joint where the superconducting medium is discontinuous.

FIG. 7 illustrates a cross-sectional view through a joint similar to that of FIG. 5 where the interconnected filament wire 32 has medium 36 contacting its sides 40 held by a support fixture 35 but with a gap 44 defined in medium 36 forming a discontinuous medium.

Figure 9:
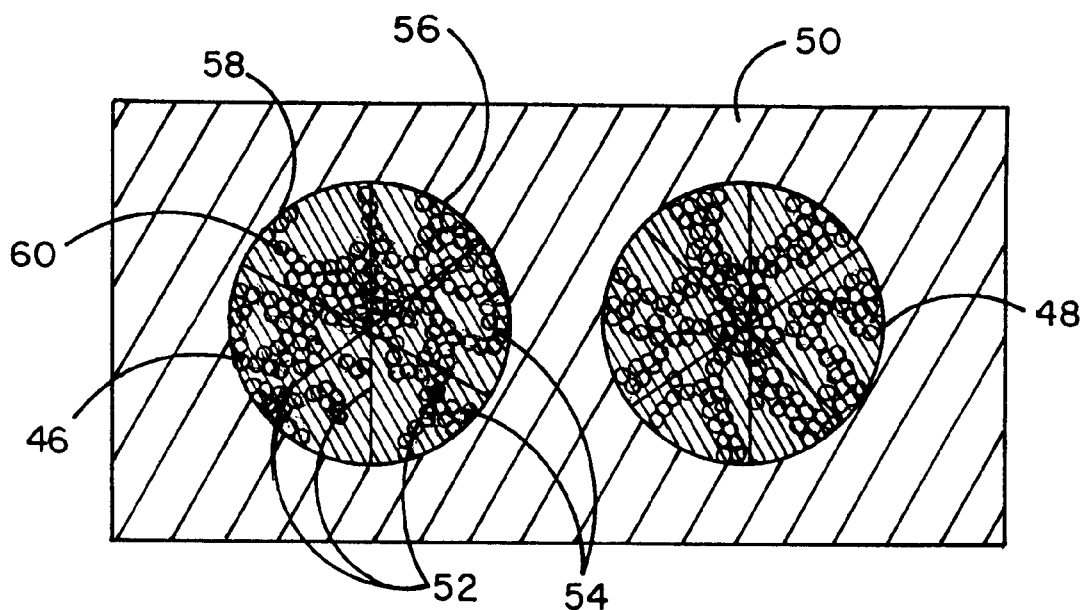
FIG. 9 illustrates an enlarged cross-sectional view of a superconducting joint where the two superconducting divided interconnected filament wires are not aligned.

FIG. 9 illustrates an enlarged cross-sectional view of a superconducting joint where the two superconducting divided interconnected filament wires 46 and 48 are not aligned. As seen in this view, wires 46 and 48 are positioned within superconducting medium 50, and each wire is divided by a plurality of non-superconducting dividers 52 which can be made of bronze or equivalent material. Such a joint, as illustrated in FIG. 9, does not have the full interconnectivity of all of the filaments of each wire due to their separation by dividers 52. The interconnected filaments 54 all have a superconducting path to the surface 46 of each wire where they complete contact through superconducting medium 50 to the interconnected filaments 54 of other segments, such as segment 60. Such dividing of the cross-sectional area, i.e. core of the wires to be joined by the non-superconducting dividers 52, reduces the AC losses of the wires for use in certain applications.

The joint concepts described in this invention are particularly useful for applications where A15 multifilamentary superconductors are used. Because A15 materials (e.g., $Nb_3Sn$ and $Nb_3Al$) are brittle in an A15 MF wire, the A15 filaments are typically 1–20 μm in thickness and are particularly fragile when separated from their matrix. This makes fabrication of joints between MF wires by conventional approaches difficult. The innovation described herein leaves the filaments intact within their matrix as the joint fabrication processes do not involve operations on separated filaments.

In some applications the matrix around the filaments of MF wires to be joined, and/or the matrix of the medium that joins them, can be removed slightly to ensure that the filament contact on the surface of adjacent wires or medium are not blocked by the matrix. In such instances the matrix is removed only slightly so that filaments are still mechanically supported by the matrix.

Superconducting joints between multifilamentary wires that use in part A15 superconducting wires can be produced either before a heat treatment using unreacted components of wire and medium; after a heat treatment using fully reacted components; or after partial heat treatment of partially reacted components. In some applications heat treatment of the superconducting medium and wire ends that are involved in making superconducting joints can be conducted independently and separately from the heat treatment of an A15 magnet. In some embodiments the wires to be joined do not require heat treatment.

Practically all MF superconducting wires include a non-superconducting cladding surrounding the MF core region of the wire. In making superconducting joints in this invention, such cladding in the area of the joint fabrication may be removed either mechanically, chemically or electrolytically.

While superconducting joints described herein cover the connecting of two wires, some applications may require connecting of more than two wires. Superconducting joints in such applications can be accomplished in basically the same manner as that for connecting two wires.

Although the present invention has been described with reference to particular embodiments, it will be apparent to those skilled in the art that variations and modifications can be substituted therefor without departing from the principles and spirit of the invention.

We claim:

1. A superconducting joint, comprising:
   at least two multifilamentary superconducting wires;
   a superconducting medium having interconnected superconducting filaments disposed therein, with said superconducting medium being in direct electrical contact and joined with filaments of said superconducting wires.

2. A superconducting joint, comprising:
   a wire containing superconducting filaments, said wire having two ends and an outer surface;
   at least one interconnected filament superconducting wire, said interconnected filament superconducting wire having two ends and an outer surface, said interconnected filament superconducting wire in electrical contact and joined with said wire containing superconducting filaments, forming a superconducting joint.

3. The superconducting joint of claim 2 wherein said interconnected filament superconducting wire is produced by a powder metallurgy process.

4. The superconducting joint of claim 2 wherein said interconnected filament superconducting wire is produced by a cable-in-tube process.

5. The superconducting joint of claim 3 further including a superconducting bridge disposed around portions of said superconducting wires wherein said connection between said superconducting wires relies both on contact between said ends of said wires and said outer surfaces of said interconnected filament superconducting wire and said superconducting filament wire contacting said bridge.

6. The superconducting joint of claim 4 further including a superconducting bridge disposed around portions of said superconducting wires wherein said connection between said superconducting wires relies both on contact between said ends of said wires and said outer surfaces of said interconnected filament superconducting wire and said superconducting filament wire contacting said bridge.

7. The superconducting joint of claim 3 wherein said interconnected filament superconducting wire is comprised of a plurality of irregular, and irregularly dispersed, superconducting filaments within a matrix medium with certain of said filaments extending to the outer surface of said wire and contacting other of said filaments within the body of said wire.

8. The superconducting joint of claim 4 wherein said interconnected filament superconducting wire is comprised of a plurality of irregular, and irregularly dispersed, superconducting filaments within a matrix medium with certain of said filaments extending to the outer surface of said wire and contacting other of said filaments within the body of said wire.

9. The superconducting joint of claim 7 wherein said interconnected filament superconducting wires are comprised of a Type A15 superconductive material.

10. The superconducting joint of claim 8 wherein said interconnected filament superconducting wires are comprised of a Type A15 superconductive material.

11. The superconducting joint of claim 9 wherein said wires to be joined are fully reacted by heat treatment.

12. The superconducting joint of claim 10 wherein said wires to be joined are fully reacted by heat treatment.

13. The superconducting joint of claim 9 wherein said wires to be joined are partially reacted by heat treatment.

14. The superconducting joint of claim 10 wherein said wires to be joined are partially reacted by heat treatment.

15. The superconducting joint of claim 9 wherein said wires to be joined are not heat treated.

16. The superconducting joint of claim 10 wherein said wires to be joined are not heat treated.

17. The superconducting joint of claim 7 wherein one of said wires is made of a Type A15 superconducting material and the other of said wires is made of a NbTi type material.

18. The superconducting joint of claim 8 wherein one of said wires is made of a Type A15 superconducting material and the other of said wires is made of a NbTi type material.

19. The superconducting joint of claim 9 wherein the junction between said Type A15 superconducting wire includes a bridge medium surrounding portions of said wires wherein said bridge medium is heat-treated.

20. The superconducting joint of claim 10 wherein the junction between said Type A15 superconducting wire includes a bridge medium surrounding portions of said wires wherein said bridge medium is heat-treated.

21. The superconducting joint of claim 19 wherein said bridge medium-surrounded wires are contained under compression within a mechanical fixture.

22. The superconducting joint of claim 20 wherein said bridge medium-surrounded wires are contained under compression within a mechanical fixture.

23. The superconducting joint of claim 21 wherein said mechanical fixture includes a shrink-fit collar.

24. The superconducting joint of claim 22 wherein said mechanical fixture includes a shrink-fit collar.

25. The superconducting joint of claim 21 wherein said bridge medium disposed around said wires is discontinuous.

26. The superconducting joint of claim 21 wherein said bridge medium disposed around said wires is discontinuous.

27. The superconducting joint of claim 7 further including:
- a section of said interconnected filament superconducting wire; and
- a pair of wires containing superconducting filaments, said section of said interconnected filament superconducting wire joining said ends of said pair of wires containing superconducting filaments.

28. The superconducting joint of claim 8 further including:
- a section of said interconnected filament superconducting wire; and
- a pair of wires containing superconducting filaments, said section of said interconnected filament superconducting wire joining said ends of said pair of wires containing superconducting filaments.

29. The superconducting joint of claim 5 wherein said interconnected filament superconducting wire is transversely divided into multiple segments by a plurality of non-superconducting dividers.

30. The superconducting joint of claim 6 wherein said interconnected filament superconducting wire is transversely divided into multiple segments by a plurality of non-superconducting dividers.

31. A method of producing a superconductive joint between two superconducting wires comprising the steps of:
- providing at least one of said superconducting wires with multiple irregularly dispersed interconnected filaments; and
- engaging said superconducting wire with multiple irregularly dispersed interconnected filaments to said other superconducting wire to form a superconductive joint.

32. A method of producing a superconductive joint between two superconducting wires comprising the steps of:
- providing at least one of said superconducting wires with multiple irregularly dispersed interconnected filaments; and
- engaging said superconducting wire with multiple irregularly dispersed interconnected filaments indirectly to said other superconducting wire to form a superconductive joint.

33. The method of claim 31 further including the steps of:
- providing said interconnected filaments within and on the outer surface of one of said wires; and
- contacting by a superconducting medium said filaments on said outer surface of said wire to said other superconductive wire.

34. The method of claim 32 further including the steps of:
- providing said interconnected filaments within and on the outer surface of one of said wires; and
- contacting by a superconducting medium said filaments on said outer surface of said wire to said other superconductive wire.

* * * * *